(12) United States Patent
Tajima et al.

(10) Patent No.: US 8,224,264 B1
(45) Date of Patent: Jul. 17, 2012

(54) RF AMPLIFIER MODULATION CIRCUIT AND RELATED TECHNIQUES

(75) Inventors: Yusuke Tajima, Acton, MA (US); Mark A. Royer, Billerica, MA (US); James A. Sozanski, Bolton, MA (US)

(73) Assignee: Auriga Measurement Systems, LLC, Chelmsford, MA (US)

( * ) Notice: Subject to any disclaimer, the term of this patent is extended or adjusted under 35 U.S.C. 154(b) by 399 days.

(21) Appl. No.: 12/618,192

(22) Filed: Nov. 13, 2009

Related U.S. Application Data

(60) Provisional application No. 61/114,137, filed on Nov. 13, 2008.

(51) Int. Cl.
*H03C 1/52* (2006.01)
*H01Q 11/12* (2006.01)
*H04B 1/04* (2006.01)

(52) U.S. Cl. ...................................... 455/108; 455/127.2

(58) Field of Classification Search .................. 455/108, 455/118, 127.1, 127.2; 330/127, 199
See application file for complete search history.

(56) References Cited

U.S. PATENT DOCUMENTS

| 6,788,151 | B2  |   | 9/2004  | Shvarts et al. |            |
|-----------|-----|---|---------|----------------|------------|
| 7,058,823 | B2  | * | 6/2006  | Lapidus        | 713/300    |
| 7,482,869 | B2  |   | 1/2009  | Wilson         |            |
| 2003/0198300 | A1 | * | 10/2003 | Matero et al. | 375/297 |
| 2004/0071225 | A1 | * | 4/2004  | Suzuki et al. | 375/297 |
| 2005/0136854 | A1 | * | 6/2005  | Akizuki et al. | 455/91  |
| 2006/0209984 | A1 | * | 9/2006  | Kenington    | 375/297 |

OTHER PUBLICATIONS

Nujira HAT™ Power Modulator; pages of catalog; Feb. 3, 2008; 2 pages.

* cited by examiner

*Primary Examiner* — Nguyen Vo
(74) *Attorney, Agent, or Firm* — Daly, Crowley, Mofford & Durkee, LLP

(57) ABSTRACT

A power supply stage includes a digital signal generation means to generate n bit digital signal, a selection means for power supply voltages in dependence on n bit digital signal and an adjusting means for receiving the selected power supply voltage and the envelope signal and adapted to generate an adjusted selected power supply voltage tracking the envelope signal.

12 Claims, 5 Drawing Sheets

RF AMPLIFIER MODULATION CIRCUIT AND RELATED TECHNIQUES

CROSS REFERENCE TO RELATED APPLICATION

This application claims the benefit of U.S. Provisional Application No. 61/114,137 filed Nov. 13, 2008 under 35 U.S.C. §119(e) which application is hereby incorporated herein by reference in its entirety.

FIELD OF THE INVENTION

The structures and techniques described herein relate to radio frequency (RF) circuits and more particularly to RF amplifier circuits.

BACKGROUND OF THE INVENTION

As is known in the art, circuitry such as that described in U.S. Pat. Nos. 6,788,151 and 7,482,869 includes a radio frequency (RF) amplifier which can be operated at high efficiency because direct current (DC) power dissipation can be reduced by tracking a change in an envelope of an RF input signal received by an RF amplifier. However, a relatively complex circuit is needed to provide a reference signal representing a desired power supply voltage that corresponds to the envelope of the RF input signal. In some cases, the reference signal is generated by detecting the input RF signal, rectifying it to generate an envelope of the input signal, and subsequently providing the envelope signal to a supply voltage adjustment circuit while at the same time providing it to a power supply selection circuit to select a desired supply voltage. In this technique, the circuits all have to be synchronized which can be relatively difficult. Furthermore, this technique is performed with analog signals. Consequently, the circuits are sensitive to variations in the operating characteristics of devices resultant from temperature changes and also to differences in device operating characteristics (e.g. due to manufacturing tolerances) which reduces yield of the circuitry.

SUMMARY OF THE INVENTION

In accordance with the circuits, techniques and concepts described herein, a power supply stage includes a digital signal generator configured to generate an n-bit digital signal, and a supply voltage selection circuit configured to receive m-bits of the n-bit digital signal and to provide a supply voltage at an output thereof with the supply voltage corresponding to a voltage level determined by the m-bits. The power supply stage further includes an envelope power supply circuit coupled to the output of the supply voltage selection circuit and configured to receive the an analog version of an envelope signal (E) generated by the digital signal generator.

The envelope power supply circuit receives the supply voltage provided by the supply voltage selection circuit and the envelope circuit and provides, at an output thereof, a bias signal appropriate for use with an RF amplifier With this particular arrangement, using the digital signal from the digital signal generator (which may, for example be provided as a digital signal processing (DSP) circuit) eliminates the need to generate control signals from an RF input signal via a control circuit. This approach not only simplifies the power supply stage circuit, but also eliminates errors and sensitivity to environmental parameter changes such as temperature as a result of analog circuits.

In accordance with the techniques and concepts described herein, a power supply stage includes digital signal generation means to generate an n-bit digital signal and an envelope signal; selection means for power supply voltages in dependence on the n bit digital signal and adjusting means for receiving the selected power supply voltage and the envelope signal and adapted to generate an adjusted selected power supply voltage tracking the envelope signal.

With this particular arrangement, using the digital signal from the digital signal generation means (which may, for example be provided as a digital signal processing (DSP) circuit) eliminates the need to generate the control circuit from an RF input signal. This approach not only simplifies the circuit but also eliminates errors and sensitivity to environmental parameter changes such as temperature as a result of analog circuit.

In accordance with a further aspect of the concepts described herein, a method includes: generating an N-bit digital signal, generating an envelope signal, selecting a power supply voltage signal wherein the value of the power supply voltage signal is selected in response to the value of at least M-bits of the N-bit digital signal and adjusting the selected power supply voltage signal and the envelope signal to generate an adjusted selected power supply voltage having a voltage level which tracks the envelope signal.

With this particular arrangement, a method for providing a bias signal to an RF amplifier is provided by adjusting the bias signal to track the envelope signal, the RF amplifier operates at an efficiency which is higher than that which would be achieved without adjusting the bias signal. Furthermore, by utilizing a digital signal to generate the bias signal, a simplified technique is provided which is not sensitive to variations in environmental conditions such as temperature.

DETAILED DESCRIPTION OF THE PREFERRED EMBODIMENTS

Figure 1:
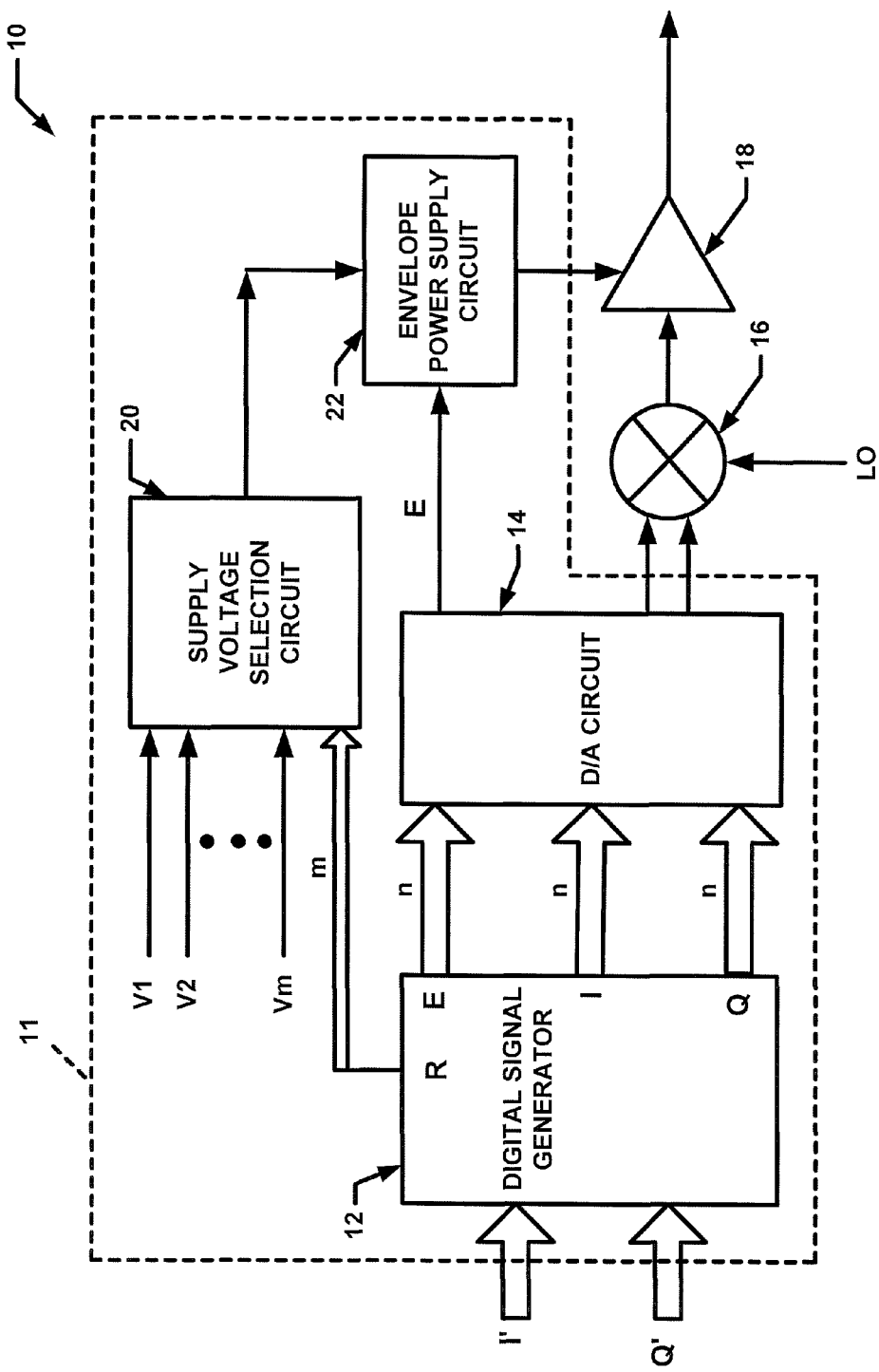
FIG. 1 is a block diagram of a power supply stage coupled to an RF amplifier.

Referring now to FIG. 1, a power supply stage 10 includes a digital signal generator 12 which generates a modulated signal in digital bits. It should be appreciated that digital signal generator 12 may be provided from a wide variety of circuits including, but not limited to, any type of microprocessor or a specialized microprocessor such as a digital signal processing (DSP) circuit 12. For reasons which will become apparent from the description provided hereinbelow, some of the bits are provided from digital signal generator 12 directly to a supply voltage selection circuit. Thus, there is no analog circuit needed to create a control signal to the supply voltage selection circuit.

A digital signal generator (e.g. DSP circuit) 12 generates three digital (I, Q, and E) each having n-digital bits and one digital signal (R) having m-digital bits, m being equal or larger than 1. In one embodiment, the digital signals may be comprised of 10-12 bits but any number of bits may be used. Those of ordinary skill in the art will appreciate how to select the number of bits to use in any particular application.

The digital signal is provided to a digital-to-analog converter (D/A or DAC) circuit 14 which converts the stream of digital bits provided thereto to baseband analog signals. Analog I/Q signals provided by the D/A circuit 14 are modulated and upconverted to a radio frequency (RF) signal. In one embodiment, this is accomplished by providing the I/Q signals and a local oscillator (LO) signal to a mixer 16. Mixer 16 combines the signals provided thereto to produce the RF signal. The RF signal is coupled from mixer 16 to an input of an RF amplifier 18. In some applications, RF amplifier 18 corresponds to an RF power amplifier.

In one exemplary embodiment, the digital signal generator 12 may be provided as a DSP circuit of the type provided by XILINX and identified as a SPARTAN XC3S400; the modulator may be provided by Polyphase Microwave with its part number QM2040A; and amplifier 18 may be provided as Eudyna's EGN35A030MK GaNHEMT.

Significantly, the digital signal generator 12 provides m-bits directly to a supply voltage selection circuit 20. In one embodiment, digital signal generator 12 generates 10-12 bits of digital IQ signals, Vi(n) and Vq(n), where Vi(n) is for an I signal and Vq(n) is for a Q signal and n is a specifier for nth bit. Using these signals, an envelope signal $V_{ENVELOPE}$ (and designated as "E" in FIG. 1) may be calculated by various equations. In one embodiment $V_{ENVELOPE}$ is calculated as shown in Equation (1):

$$V_{ENVELOPE}(n) = Sqrt(Vi(n)^2 + Vq(n)^2) \quad \text{Equation (1)}$$

Although it is possible, in general it is not practical to prepare rail voltages (designated as "V1", "V2" . . . "Vm" in FIG. 1) using as many as ten to twelve bits as substantial power savings can be achieved using only three to four bits of resolution. Thus, in one exemplary embodiment, a three-bit signal was used to provide the signal.

Figure 4:
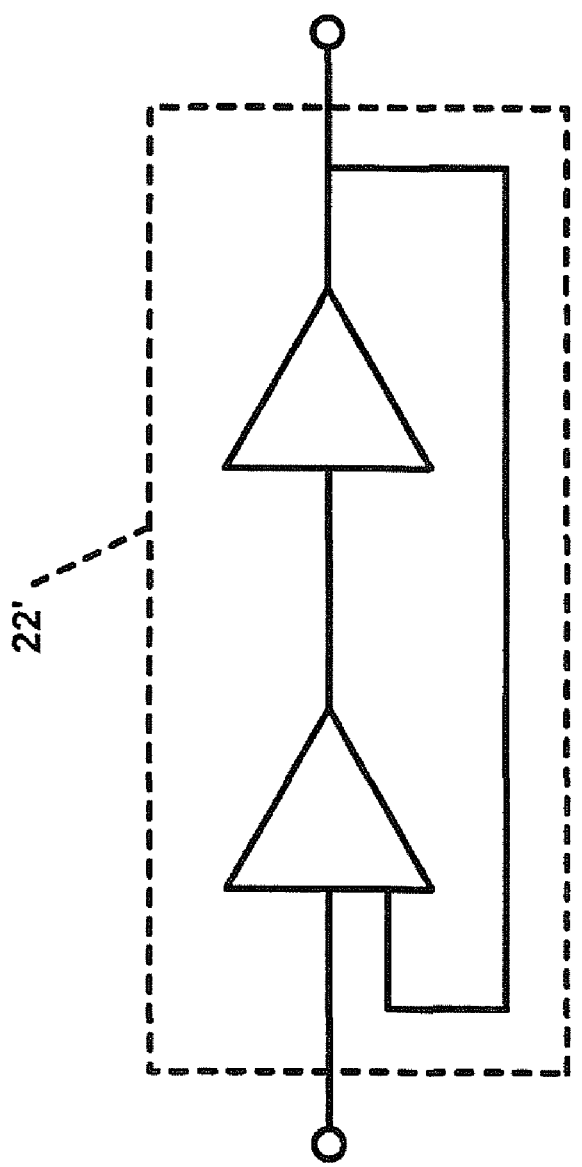
FIG. 4 is a circuit diagram of an exemplary envelope power supply circuit.

The rail selection signal (designated as "R" in FIG. 1), m-bits (e.g. three bits) of digital signal are supplied to a supply voltage selection circuit 20. Based upon the value of the digital signal provided thereto (in this particular example, the value of the 3 bit digital signal R), the voltage selection circuit selects a bias condition ("V1", "V2" . . . or, "Vm") deemed to be the most efficient bias condition and provides an appropriate signal to an envelope power supply circuit 22. An exemplary envelope power supply circuit is shown in FIG. 4.

In one exemplary embodiment, the envelope power supply circuit incorporates an operation amplifier U4A DAMP_2 cascaded to a MOSFET amplifier using Triquint's PDL 400. The envelope power supply circuit also receives the envelope signal E from DAC 14 and amplifies the envelope signal E to an appropriate level to act as a bias signal for RF amplifier 18. Ideally, the bias condition of the envelope power supply circuit 22 is always at the most efficient bias rail, which is selected by the supply voltage selection circuit 20. In one embodiment, the envelope power supply circuit 22 is used to modulate a drain voltage of RF amplifier 18 in time synchronization with the microwave signal such that the power amplifier is always operating at optimal efficiency.

Digital signal generator 12 generates three n-bit digital signals (n is adjustable depending on specific application) as follows: (1) a digital in-phase signal (known as I); (2) a digital quadrature signal (known as Q); and (3) a digital envelope (E=SQRT($I^2+Q^2$)). The three digital signals, I, Q and E are created from two digital inputs I' and Q'. Q and E are formed from I' and Q' using pre-distortion algorithms executed in digital signal generator 12. The pre-distortion algorithms are designed to optimize fidelity of the microwave output signal of the RF amplifier and the efficiency of the RF power amplifier.

In one embodiment, the three digital signals, I, Q and E are fed to three separate DACs 14. DACs 14 receive the digital signals provided thereto and generate continuously variable analog voltage versions of the signals. The analog envelope (E) is fed to the envelope power supply while the analog I and Q signals are provided to a quadrature modulator 16.

Quadrature modulator 16 forms an amplitude and phase modulated RF signal that embodies the original information contained in the I' and Q' signals. Envelope power supply circuit 22 feeds a variable drain voltage (the 'envelope' E) to the RF amplifier 18 such that amplifier 18 always or substantially always operates at optimum or near-optimum efficiency. However, the envelope power supply itself is a Class G amplifier so that it is also operating efficiently. As mentioned above, R (m-bits, adjustable depending on specific application) is also fed to the supply voltage selection. These bits are used to select optimum rail voltage used to drive the Class G amplifier in the envelope power supply most efficiently.

Figure 2:
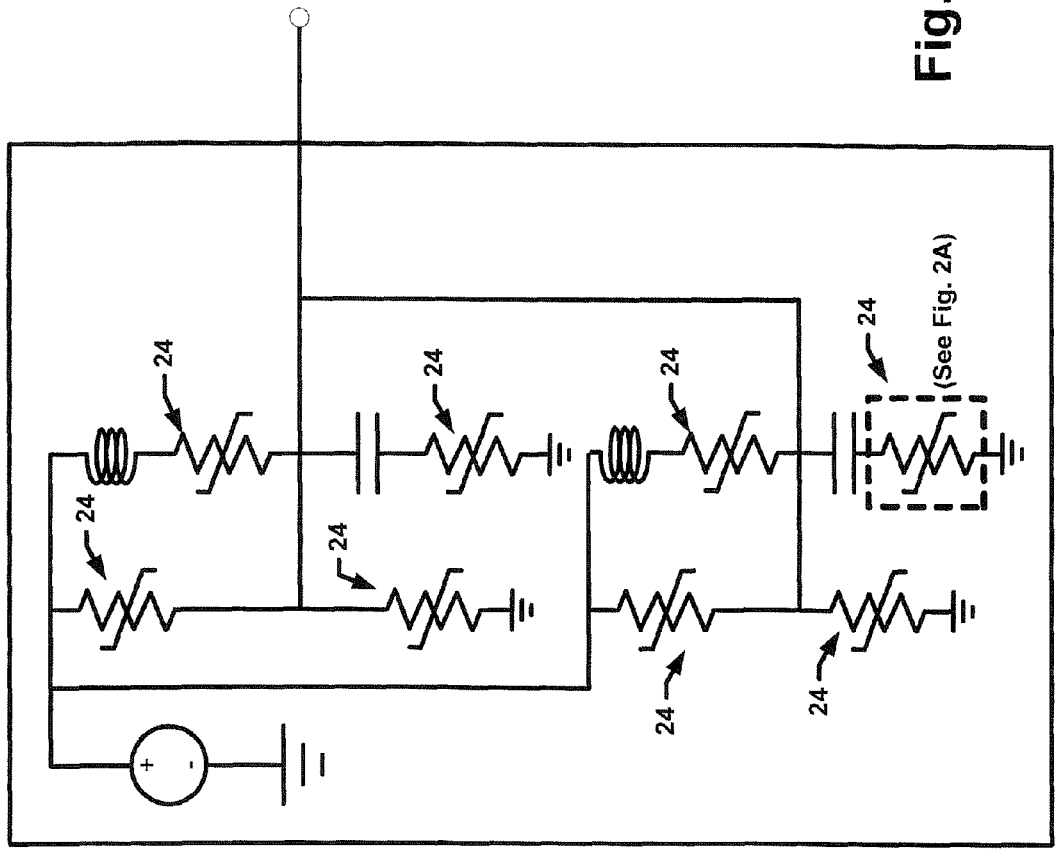
FIG. 2 is a block diagram of a power supply stage.
Figure 2A:
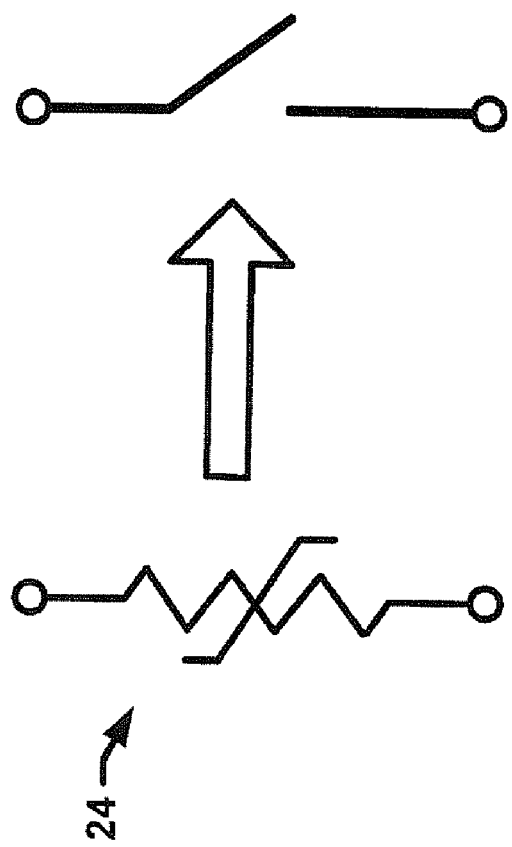
FIG. 2A is a schematic diagram and a representation of a switch controlled by a digital signal.

The supply voltage selection circuit 20 may comprise a power supply circuit configured to generate multiple levels of rail voltages, or a plurality of power supplies from which the best supply voltage is selected (as exemplified by "V1", "V2", . . . "Vm" in FIG. 1), according to the reference (envelope) signal level. One example of a single circuit that generates multiple levels of rail voltages using a digital input is shown in FIGS. 2 and 2A. It should be understood that other circuits and techniques may, of course, also be used to provide this function.

Using the digital signal from the DSP circuit eliminates the need to generate the control circuit from RF input signal.

In prior art circuits such as that described in the aforementioned U.S. Pat. No. 7,482,869 the RF input signal is picked up at the input port and processed to generate control signals for power modulator.

In contrast, in accordance with the concepts, circuits and techniques described herein, this becomes unnecessary. This not only simplifies the circuit but also eliminates at least some errors of the analog circuitry as well as sensitivity of the analog circuitry to the environmental parameter changes such as temperature. Unlike analog circuitry, digital circuitry (e.g. the DSP) is by its nature, is relatively immune to the analog effects of the surrounding environment (that is, the digital circuitry is immune as compared with analog circuitry. Indeed, this is a driving motivator in the use of digital signal processing vs. traditional analog signal processing.

In accordance with the circuits and techniques described herein, in one embodiment, the DSP is configured to operate such that the supply voltage rails are selected always to be above or equal to the envelope signal generated by the envelope power supply circuit. This is accomplished by selecting the most significant m bits of the envelope to form the rail selection signal (designated as R in FIG. 1).

In other embodiments the DSP circuit may be programmed so that the supply voltage rails are selected to be above, equal to or below the envelope signal generated by the envelope power supply circuit.

Figure 3:
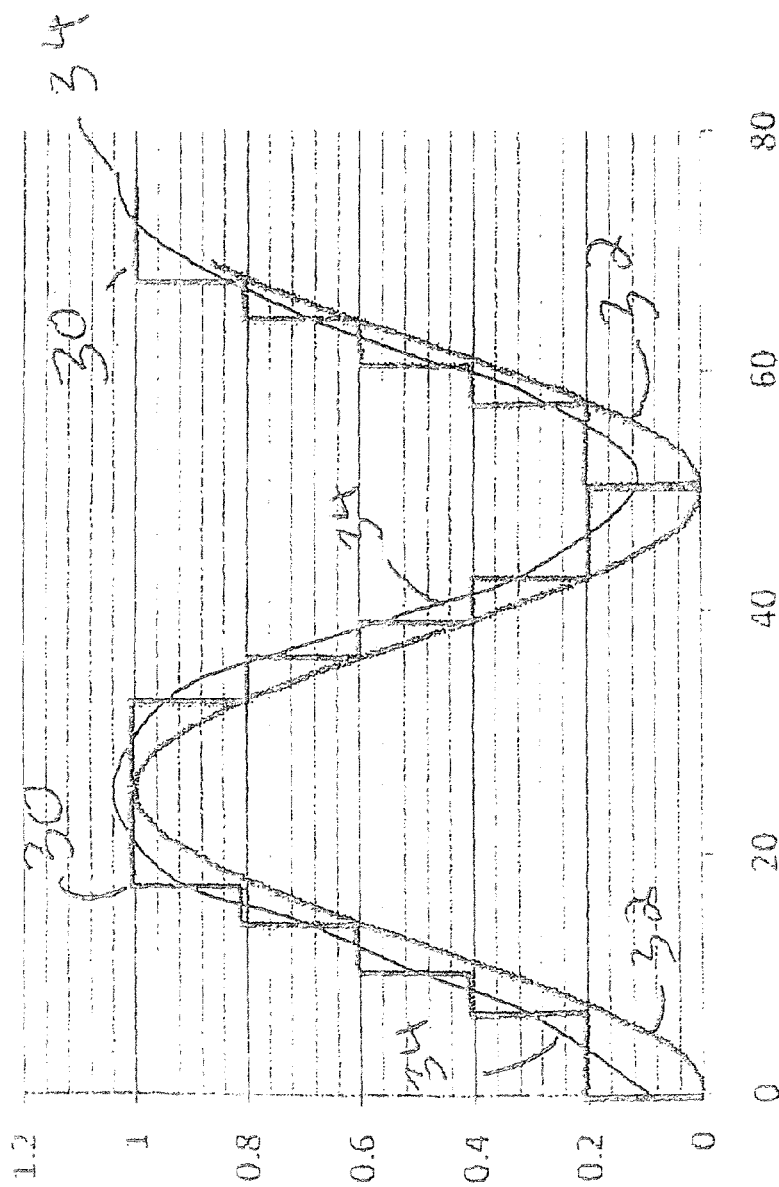
FIG. 3 is a plot of voltage vs. time which illustrates step and rail voltages.

As shown in FIG. 3, the voltage rails are identified with reference numeral 30 while the input signal is identified with reference numeral 32.

The particular number of bits to use for the I and Q signals are application dependent. Depending upon the specific target communication system, the number of bits will vary. The number of bits of envelope E is an implementation issue depending on the overall target efficiency.

The I and Q signals, both in digital and analog form, are the embodiment of the user's original signal content (I' and Q') in a form distorted to maximize the overall fidelity and efficiency of the transmission system. I and Q from the D/A's to the quadrature modulator are at baseband. They are combined into an amplitude and phase modulated signal which is then upconverted to RF using a mixer with an externally provided LO. The frequency of the LO is set depending on the operational RF band of the target system.]

Referring now to FIGS. 2 and 2A, in one embodiment, the supply voltage circuit comprises a power supply circuit that can generate multiple levels of rail voltages, or a plurality of power supplies from which the best supply voltage is selected, according to the reference (envelope) signal level. An example of a single circuit that generates multiple levels of rail voltages using a digital input is shown in FIG. 2.

In the circuit of FIG. 2, eight (8) switches 24 are controlled by the digital signal provided from the DSP to generate four different voltage levels. A filter may optionally be added to the output port to eliminate spurious signals. Those of ordinary skill in the art will appreciate, of course, that any number of switches may be used to provide any desired number of different voltage levels.

Referring now to FIG. 3, a plot of voltage vs. time illustrates a supply rail voltage 30 having discrete steps, which follow the voltage of a continuous wave input signal 32. Wasted heat on the output devices can be reduced as excess voltage is kept to a minimum. The amplifier that is fed with these rails themselves can be of any class. As is known, Class G amplifiers are marked by variation of the supply rails (e.g. in discrete steps 30) or in a continuous fashion 34 as shown in FIG. 3 following the input signal 32.

Referring now to FIG. 4, an exemplary circuit diagram which may be use to provide an exemplary envelope power supply circuit is shown.

Having described preferred embodiments which serve to illustrate various concepts, structures and techniques which are the subject of this patent, it will now become apparent to those of ordinary skill in the art that other embodiments incorporating these concepts, structures and techniques may be used. For example, the digital signals may be generated via a circuit other than a DSP circuit, Thus a digital signal generation means other than a DSP may be used. Also, the DSP circuit or digital signal generation means may be implemented as two or more separate circuits or processes. Accordingly, it is submitted that that scope of the patent should not be limited to the described embodiments but rather should be limited only by the spirit and scope of the following claims.

What is claimed is:

1. A circuit comprising:
    a digital signal processor (DSP) having one or more outputs ports, said DSP for generating at east three digital signals with a first one of the digital signals corresponding to a digital in-phase signal (I), a second one of the digital signals corresponding to a digital quadrature-phase signal (Q) and a third one of the digital signals corresponding to an envelope signal (E);
    a digital to analog converter (DAC) circuit coupled to receive the I, Q and E signals at digital input ports and to provide analog versions thereof at first, second and third output ports;
    a supply voltage selection circuit having a first plurality of inputs, each of said first plurality of inputs configured to couple to at least one rail voltage and having a second plurality of inputs configured to accept signals from said DSP and to provide an output voltage signal in response to values of the signals from said DSP;
    an envelope power supply circuit configured to receive an output voltage signal from said supply voltage selection circuit and an analog version of the envelope signal and to provide an amplifier bias voltage at an output there of wherein the voltage level of the amplifier bias voltage tracks the envelope signal; and
    an upconverter having a pair of input ports coupled to the first and second output ports of said DAC to receive analog versions of the I and Q signals, having a local oscillator port and having an RF output port; and
    an RF amplifier having an RF input port coupled the RF output port of said upconverter, an RF output port coupled to an output port of the circuit and a bias port coupled to an output of the envelope power supply circuit wherein the at least three digital signals generated by said DSP are each provided having N-bits and wherein the most significant M-bits of at least one of the at least three digital signals is provided to said supply voltage selection circuit such that the supply voltage rails are selected always to be above or equal to the envelope signal generated by the envelope power supply circuit.

2. The circuit of claim 1 wherein the DAC circuit comprises:
    a first DAC configured to accept the digital in-phase signal and to provide an analog version of the I signal at an output thereof;
    a second, different DAC configured to accept the digital quadrature-phase signal and to provide an analog version of the Q signal at an output thereof; and
    a third, different DAC configured to accept the digital envelope signal and to provide an analog version of the E signal at an output thereof.

3. The circuit of claim 1 wherein said DSP operates such that the supply voltage rails are selected to be above the envelope signal.

4. The circuit of claim 1 wherein said DSP operates such that the supply voltage rails are selected to be equal to the envelope signal.

5. The circuit of claim 1 wherein said DSP operates such that the supply voltage rails are selected to be below the envelope signal.

6. The circuit of claim 1 wherein said DSP operates such that the supply voltage rails are selected to be above, equal to or below the envelope signal generated by the envelope power supply circuit.

7. A method comprising:
    generating an N-bit digital signal;
    generating an envelope signal;
    selecting a power supply voltage wherein the value of the power supply voltage signal is selected in response to the value of at least M bits of N-bit digital signal; and
    adjusting the selected power supply signal and the envelope signal to generate an adjusted selected power supply voltage signal having a voltage level which tracks the envelope signal wherein selecting a power supply voltage signal wherein the value of the power supply voltage signal is selected in response to the value of the M most significant bits of the N-bit digital signal where M<N.

8. The method of claim 7 wherein generating an N-bit digital signal and an envelope signal comprises generating at least three N-bit digital signals with a first one of the three N-bit digital signals corresponding to a digital in-phase signal (I); a second one of the three N-bit digital signals corresponding to a digital quadrature-phase signal (Q); and a third one of the three N-bit digital signals corresponding to the envelope signal (E).

9. The method of claim 7 further comprising:
converting the an N-bit digital signal to an analog version thereof; and
converting the envelope signal to an analog version thereof and wherein adjusting the selected power supply voltage signal and the envelope signal comprises adjusting the selected power supply voltage signal and the analog version of the envelope signal.

10. The method of claim 7 wherein generating an N-bit digital signal comprises generating at least three digital signals with a first one of the digital signals corresponding to a digital in-phase signal (I), a second one of the digital signals corresponding to a digital quadrature-phase signal (Q) and a third one of the digital signals corresponding to an envelope signal (E).

11. The method of claim 10 further comprising converting the I, Q and E signals from digital signals to analog signals.

12. The method of claim 10 further comprising:
upconverting the analog versions of the I and Q signals to generate an RF signal;
providing the RF signal to an input of an RF amplifier; and
modulating, via the envelope signal and the selected power supply voltage signal, a drain voltage of the RF amplifier in time synchronization with the RF signal.

\* \* \* \* \*